United States Patent
Pike (10) Patent No.: US 6,410,927 B1
(45) Date of Patent: Jun. 25, 2002

(54) SEMICONDUCTOR WAFER ALIGNMENT METHOD USING AN IDENTIFICATION SCRIBE

(75) Inventor: Christopher Lee Pike, Fremont, CA (US)

(73) Assignee: Advanced Micro Devices, Inc, Sunnyvale, CA (US)

( * ) Notice: Subject to any disclaimer, the term of this patent is extended or adjusted under 35 U.S.C. 154(b) by 0 days.

(21) Appl. No.: 09/296,043

(22) Filed: Apr. 21, 1999

(51) Int. Cl.[7] .......................... H01L 21/66; G01B 11/26
(52) U.S. Cl. ..................... 250/491.1; 356/401
(58) Field of Search ................ 250/491.1; 356/399, 356/401

(56) References Cited

U.S. PATENT DOCUMENTS

| | | | | |
|---|---|---|---|---|
| 4,376,581 A | * | 3/1983 | Mayer | 355/77 |
| 4,413,186 A | * | 11/1983 | Uema | 250/491.1 |
| 4,418,467 A | * | 12/1983 | Iwai | 250/491.1 |
| 5,381,004 A | * | 1/1995 | Uritsky et al. | 250/307 |
| 5,831,738 A | * | 11/1998 | Hine | 356/399 |
| 5,847,821 A | | 12/1998 | Tracy et al. | 356/237 |
| 6,084,679 A | * | 7/2000 | Steffan et al. | 356/401 |

* cited by examiner

Primary Examiner—Jack Berman
(74) Attorney, Agent, or Firm—LaRiviere, Grubman & Payne, LLP (57) ABSTRACT

In a method for detecting defects in both processed and unprocessed (blank) wafers, a manufacturer's identification mark is used to align wafers during inspection. The wafers, are subject to an initial scan under low magnification using an inspection tool and transferred to a high magnification analysis tool for more complete analysis. Prior to scanning, the wafers are oriented using the manufacturer's identification mark. The wafers become misaligned when transferred between tools. Using the manufacturer's identification mark, the wafers are reoriented and aligned. During scanning, defects in the wafer surface are located. The location of all defects are referenced to the location of the manufacturer's identification mark. To easily find defects when a wafer is transferred from tool to tool, the manufacturer's identification mark is located and, using a software algorithm, the wafer is oriented and aligned to the mark each time it is transferred and inspected. When placed in an analysis tool, the software algorithm aligns the wafer using the manufacturer's identification mark. This allows the analysis tool to navigate directly to the desired features (i.e. defects) without wasting undue time searching for them. Furthermore, a wafer can be aligned using the mark and inspected for defects and then subjected to processing, after which the wafer is realigned using the mark and inspected again. This allows easy identification and examination of defects introduced during processing.

17 Claims, 6 Drawing Sheets

SEMICONDUCTOR WAFER ALIGNMENT METHOD USING AN IDENTIFICATION SCRIBE

TECHNICAL FIELD

The present invention relates to a method of wafer alignment, defect detection, and analysis for semiconductor wafers. More specifically, this invention relates to methods of locating defects on both processed and unprocessed semiconductor wafers, thereby allowing analysis and defect review tools to navigate directly to previously identified defects for examination at high magnification.

BACKGROUND OF THE INVENTION

In order to remain competitive, semiconductor manufacturers must continually increase integrated circuit performance while reducing cost. A factor in cost reduction and performance enhancement is the reduction of device dimensions, thereby increasing circuit density on an integrated circuit chip. Cost reductions are also achieved by increasing the yield. The number of good chips obtained from a wafer determines the yield. As may be expected, defective chips that are discarded increase the cost of the remaining nondefective chips.

It is important to identify and review defects on blank wafer surfaces because the presence of defects has the potential to decrease yield. Furthermore, it is important to review wafer defects throughout the fabrication process continually monitoring the wafer for defects introduced during each step of manufacturing.

Existing methods of defect inspection utilize a number of detectors which have been developed to measure the number, location, and size of defects on a wafer surface. One type of detector is known as a laser surface particle detector (LSPD). However, the LSPD by itself does not always provide sufficient information regarding the magnitude and cause of defects. In almost all cases, the defects must be further analyzed to identify the source of the defect and its magnitude. A scanning electron microscope (SEM) equipped with an energy-dispersive X-ray spectroscopy (EDS) system works well for measuring the details of defects in a wafer surface. However, due to the extremely small field of view of the SEM, defects are difficult to find on a blank wafer surface. Existing techniques use a combination of the LSPD to locate defects on the wafer surface and the SEM/EDS system to analyze the defects. A number of combined systems are used in the semiconductor industry to quantify defects in wafer systems. However, as chip technology improves and device geometry shrinks, the need to find smaller and smaller defects increases. This requires an analysis system that is able to detect and analyze smaller defects. A major problem in the analysis of small defects is the problem of locating the defects with the SEM after they have been identified with the LSPD. When the wafers are transferred between various machines they become misaligned. Frequently, the wafer misalignment is so great that the SEM may not use the minimum magnification to observe the defects. The current industry standard is that a minimum of 1500× magnification is usually required on an SEM in order to see a $0.6\mu$ defect. For typical cathode-ray tube (CRT) screens, this translates to a field of view of 70×70 microns. This means that a defect's position must be known with an error of less than $35-40\mu$ in order for an SEM to find the defect. If the SEM is positioned too far from the defect, analysis time is wasted searching for defects. This position error is a major problem and, if the position error exceeds $100\mu$, an inordinate amount of time must be taken searching for defects.

Presently, position error is reduced by having the integrated circuit (IC) manufacturer scribe fiducial marks on blank wafers after receiving the wafers from the wafer manufacturer. By scribing two or more fiducial marks on the wafer surface, the number and position of the fiducial marks can be determined. These fiducial marks in conjunction with locations of known defects are used as the basis of a coordinate reference system. A typical system used to determine the location of defects on a blank wafer is disclosed in U.S. Pat. No. 5,847,821 of Tracy, et al., which is incorporated by reference herein. The method of Tracy requires that blank wafers received by the IC manufacturer from the wafer manufacturer be scribed with fiducial marks. Typically, this is accomplished by using a laser-scribing tool. These marks form the basis of coordinate mapping and defect location schemes. There are disadvantages to having the IC manufacturer add fiducial marks. The process of scribing the fiducial marks is a time-consuming process which increases manufacturing time and costs. Furthermore, the fiducial marks may take up valuable wafer surface space and reduce the area available for fabricating circuit structures, thereby reducing yield. Additionally, during processing the fiducial marks or reference defects may become covered by deposited materials (e.g. lithographic patterns, metallization layers, oxide layers, dielectric layers, etc.), making them useless as reference points. Also, the very process of scribing fiducial marks contributes to the formation of additional defects.

Therefore, what is needed is a method of aligning a semiconductor wafer on one or more inspection and analysis tools without the need for added fiducial marks. What is also needed is a method for identifying the position on the wafer of defects and for an analysis tool to be able to rapidly locate the defects for analysis without need for the addition of fiducial marks.

SUMMARY OF THE INVENTION

The present invention is directed to a method for aligning semiconductor wafers in inspection and analysis tools. The method of the present invention also allows an inspector to orient a wafer in an inspection or analysis tool then navigate directly to defects on an unprocessed (or processed) wafer at high magnification. The method uses the manufacturer's scribe as a coordinate reference, alleviating the need for the IC manufacturer to laser scribe additional reference marks (fiducial marks).

Unprocessed ("blank") wafers are received by the IC manufacturer having a manufacturer's identification number (the "scribe") scribed onto their surface. Furthermore, wafers are typically manufactured having a flat edge or a notch at the wafer's edge (the flat and notch will collectively be referred to hereinafter as a "notch"). The unprocessed wafer is placed in an inspection tool. The position of a wafer notch is determined and the wafer is roughly aligned. Subsequently, the scribe is located under low magnification. A software algorithm is used to define the area occupied by the scribe. The positions of the scribe and notch are determined and the coordinates of their locations are recorded using the software algorithm. The inspection tool is then used to locate a first set of defects. The locations of these defects are determined and coordinates mapped relative to the notch and scribe by the software algorithm. The wafer is then transferred to an analysis tool, which rapidly performs calculations using the position coordinates of the scribe and/or the notch to correctly orient the wafer. Using the position coordinates of the scribe and the position coordinates of the notch, the analysis tool navigates directly to the position of each of the first set of defects at high magnification.

The present invention is also directed to a method of defect analysis in which an unprocessed wafer can be sent through a series of selected process tools and second and subsequent sets of additional defects may be determined and analyzed.

The present invention is also directed to a method of defect analysis in which a wafer may be analyzed after individual processing steps and the presence of additional defects may be determined and analyzed.

The present invention may be better understood upon consideration of the following detailed description, in conjunction with the accompanying drawings. As will become readily apparent to those skilled in the art, the embodiments of the present invention are shown and described by way of illustration of the principles of the invention. As will be realized, the invention is capable of other embodiments and its several features are capable of modifications in various aspects, all without departing from the scope of the invention. Accordingly, the drawings and detailed description will be regarded as illustrative in nature and not restrictive.

BRIEF DESCRIPTION OF DRAWINGS

In the drawings:

FIG. 2b is a magnified view of the manufacturer's scribe shown in FIG. 2a.

Reference numbers refer to the same or equivalent parts of the invention throughout the several figures of the drawings.

DETAILED DESCRIPTION OF THE INVENTION

In accordance with the principles of the present invention a method of using a manufacturer's scribe to align and orient a semiconductor wafer is disclosed. Also disclosed is a semiconductor wafer defect detection and analysis method using the manufacturer's scribe as a common reference to accurately align and orient wafers for inspection. The present invention does not require the IC manufacturer to scribe additional fiducial marks on a wafer. This feature increases the speed of the defect analysis process.

Figure 1:
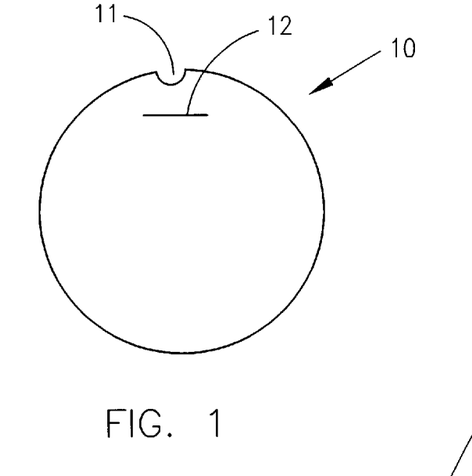
FIG. 1 is a plan view of a typical unprocessed semiconductor wafer.
Figure 2A:
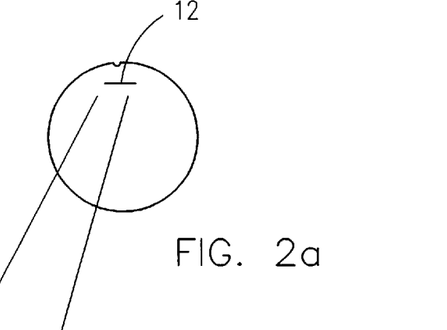
FIG. 2a is a plan view of a semiconductor wafer showing the manufacturer's scribe and the "notch".
Figure 2B:
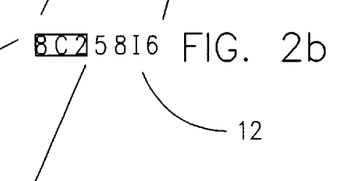
Figure 2C:
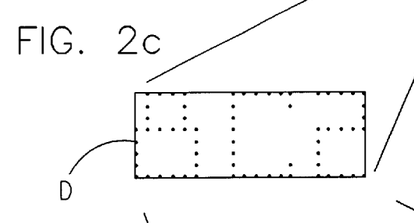
FIG. 2c is a magnified view of the three left-most characters of manufacturer's scribe shown in FIG. 2b highlighting the "dots" forming the characters.
Figure 2D:
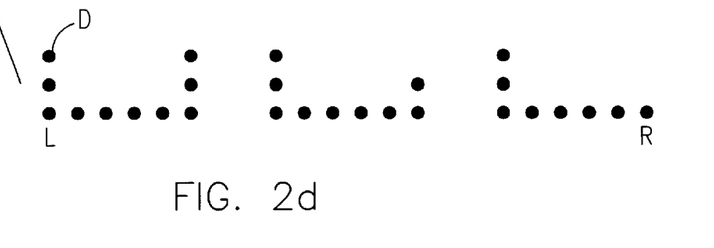
FIG. 2d is a magnified view of the "dots" shown in the three left-most characters of manufacturer's scribe shown in FIG. 2c.

Wafers are moved from one inspection tool or process tool to another during processing. In order to easily find and examine defects, re-alignment of the wafers is necessary. This is because slight changes in wafer orientation result in an inability of subsequent inspection tools to easily locate defects or other features of interest. Making reference to FIG. 1, wafers 10 are typically shipped to customers having a notch 11 and a manufacturer's scribe 12 on the surface of the wafer 10. The scribe 12 is typically a manufacturer identification code. Referring to FIGS. 2a and 2b, the scribe 12 usually comprises a series of letters and/or numbers that the manufacturer uses to identify the wafer 10. Typically, the scribe 12 is formed of a series of dots D (FIGS. 2c and 2d) placed on the wafers 10 by the manufacturer's scribing tool. This is depicted in FIGS. 2c and 2d which show the scribe 12 of FIGS. 1, 2a, and 2b under magnification. With continued reference to FIGS. 2c and 2d, these dots D may be further magnified and used as a defect location coordinate reference system by the method of the present invention.

A typical illustration of the principles of the present invention is to provide a blank wafer 10, orient the wafer 10 in an inspection tool using the scribe 12, then scan for defects on the wafer 10 surface. The location of the defects is then recorded in an initial defect map using the scribe as a coordinate reference. As the wafer 10 is subject to further processing the wafer 10 may be placed in an inspection tool after processing and scanned for defects creating another defect map. Due to the presence of a common reference point (the scribe) the two defect maps can be overlaid and compared. This allows process engineer's to analyze whether a given process introduces further defects and the nature of those defects.

Figure 3:
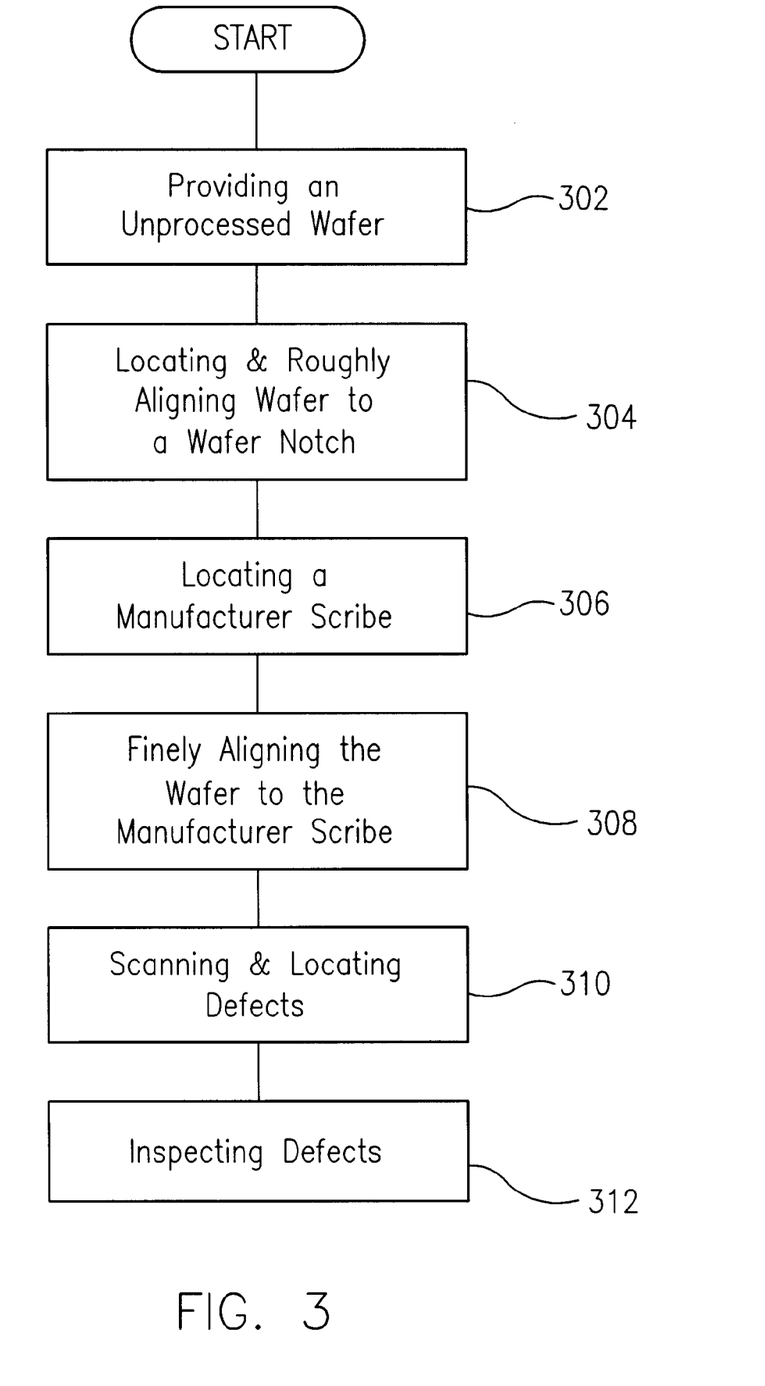
FIG. 3 is a flow diagram illustrating a process of the present invention.

FIG. 3 is a flow diagram showing a method using the principles of the present invention to align wafers and inspect wafer defects. The first Step 302 is providing an unprocessed wafer 10, said wafer having a manufacturer's scribe 12 located on the wafer surface. In Step 304, the wafer 10 is placed in an inspection tool (not shown) and roughly aligned. For example, such an inspection tool is a laser surface particle detector. Satisfactory tools include the 21xx produced by KLA-Tencor of San Jose, Calif. or the 8500 produced by Inspex, Inc. of Billerica, Mass. The wafer 10 is then roughly aligned using the wafer notch 11. Subsequently, in Step 306, the manufacturer's scribe 12 is located. Typically, this is accomplished using the inspection tool under low magnification thereby providing a second rough alignment of the wafer 10. After the scribe 12 is located under low magnification a fine alignment to the scribe 12 is done at a magnification of between about 2–5× in Step 308. A software algorithm, is used to define the location of the scribe 12 and align the inspection tool using the scribe 12. After fine alignment, the wafer 10 is scanned for defects in Step 310. The location of the defects relative to the scribe 12 is stored by a data storage means. Subsequently, in Step 312, the defects may be closely inspected using the appropriate tools and the fine alignment information generated by Step 308.

Figure 4:
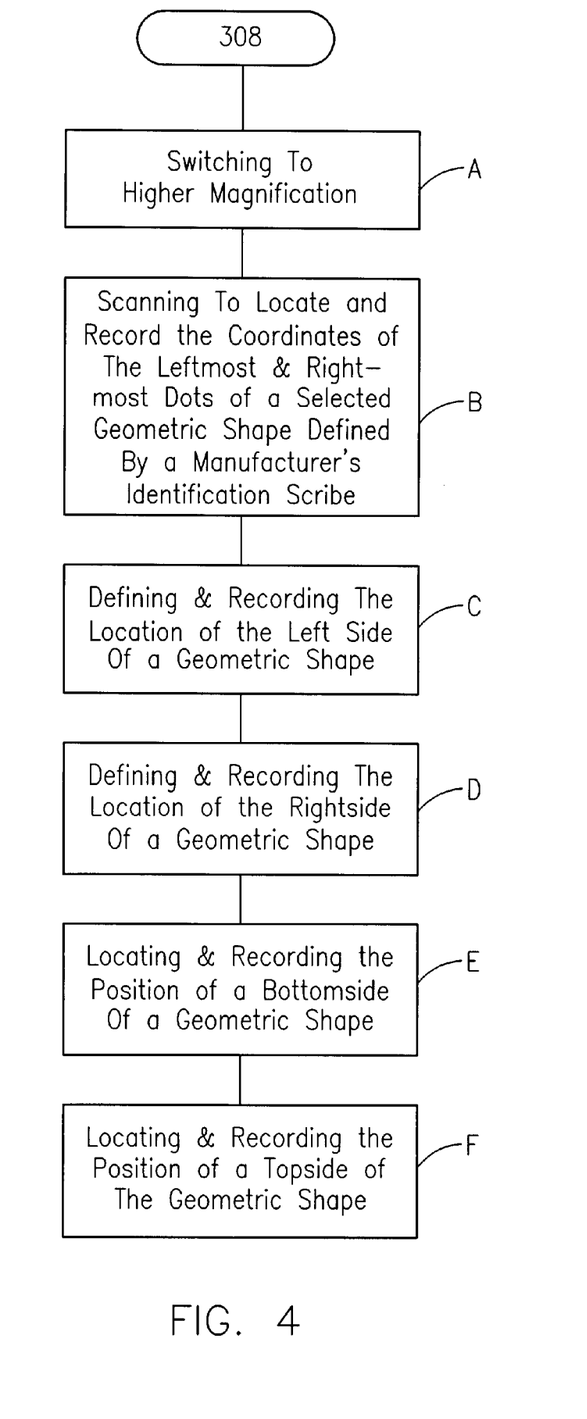
FIG. 4 is a flow diagram illustrating a fine alignment process of the present invention.
Figure 5:
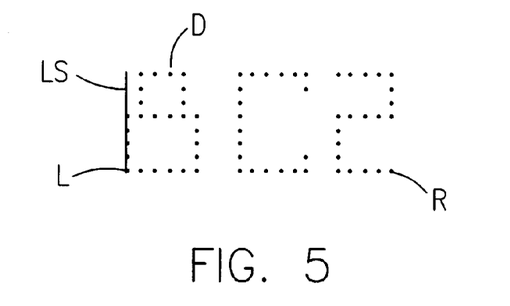
FIGS. 5–8 illustrate a fine alignment process of the present invention as applied to the symbols of a manufacturer's scribe.
Figure 6:
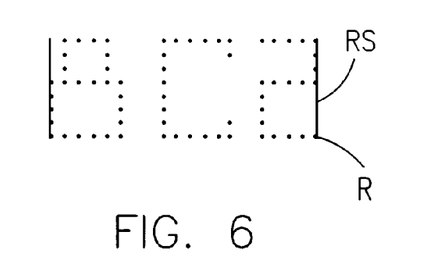

With continuing reference to FIG. 3 and reference to FIG. 4, the find alignment to the scribe 12 of Step 308 may be a accomplished in a number of ways but a preferred method uses a software algorithm to define a geometric shape enclosing all or part of the scribe 12. This may be accomplished as indicated in FIG. 4, which illustrates the principles of the present invention. Referring to FIGS. 4 and 5, the method of the present invention is used to define a geometric shape involving only a portion of the entire scribe 12. A rectangle is selected as the geometric shape, the algorithm defines the rectangle as follows. With reference to FIG. 4 and as illustrated in FIGS. 5 through 8, the "rectangle" is defined by the first three symbols of the scribe 12

"8C2". The entire scribe 12 could be used to define a geometric shape but is illustrated here using only the left-most three symbols. FIGS. 5 through 8 depict the scribe 12 under high magnification.

The flow chart of FIG. 4 outlines the basic steps the software algorithm uses to align the inspection tool with the scribe 12. It will be appreciated by one having ordinary skill in the art that many different geometric shapes and possible variations may be used to finely align the wafer 10 to the scribe 12. The sequence of steps of FIG. 4 is merely one method of practicing the principles of the present invention. As described in Step 306, the scribe 12 is located under low magnification and fine alignment of Step 308 may begin. Step A of FIG. 4 begins by increasing the magnification of the inspection tool to resolve individual dots D. In Step B, the inspection tool scans the left-most edge of the scribe 12 (i.e. the left edge of the "8"), then scans to the right-most edge of a chosen symbol (in this case "2"). This defines the left and right edges of the rectangle. Using the bottom row of dots B as the horizontal x-axis, the inspection tool scans to the left-most dot L and records the location as an x-coordinate defining the left-most boundary of the geometrical shape (rectangle) encompassing the scribe 12. Then the inspection tool scans to the right, determining the location of the right-most dot R. In the present example, this would be the right-most dot in the symbol "2". The x-coordinate of the right-most dot R is determined and recorded by the software algorithm of the present invention. It is appreciated by one having ordinary skill in the art that any portion of the scribe 12, including the entire scribe 12, may be used to define the geometric shape used for finely aligning the wafer 10.

Figure 7:
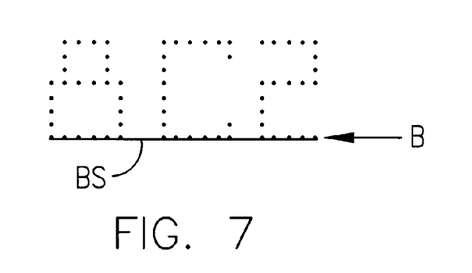
Figure 8:
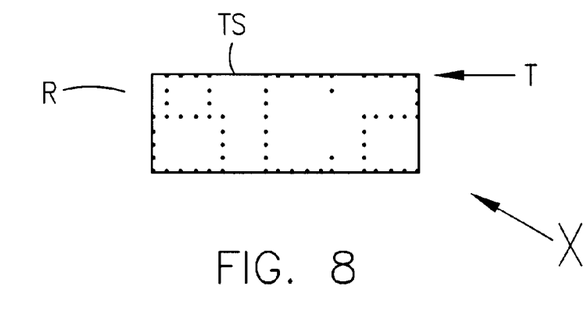

The x-coordinates of the left-most L and right-most R dots serve as reference points which define the left and right sides of the rectangle (LS, RS). In Step C, the inspection tool, in conjunction with the software algorithm, scans to the left-most dot L and having the same x-coordinate as L, defines a vertical row of dots LS (those forming the left edge of the "8") as the left side of the rectangle LS. In Step D, the inspection tool scans to the right-most dot R and defines a vertical row of dots having the same x-coordinate as R (those forming the right edge of the "2") as the right side of the rectangle RS. With reference to FIGS. 4 and 7, in Step E, the inspection tool scans to the bottom-most row of horizontal dots B of the scribe 12 and records the y-coordinates of the row (the y-axis being orthogonal to the previously defined x-axis). The bottom-most row of dots B serves as the bottom side of the rectangle BS. Finally, with reference to FIGS. 4 and 8, in Step F, the inspection tool scans upward to determine the location of the top-most row of dots T, and records the y-coordinates of the top-most side of the rectangle TS. The x and y coordinates of the four sides (RS, LS, BS, TS) of the rectangle R serve as a coordinate reference which may be used to finely align the wafer 10 as it is moved from the various process tools and inspection devices. This information may be used by the software programs of any subsequently used inspection or process tools to locate the scribe 12, define the scribe 12, and use it as a finely aligned reference for any further processes or inspections. It should be noted that the term "geometric shape" is to be broadly interpreted, including but not limited to, squares, triangles, and other geometric forms. In fact, even a simple line, such as that defined by the bottom row B of dots of the scribe, may be used to align the wafer 10.

With reference to FIG. 3, after fine alignment, in Step 310 the wafer 10 is scanned for the presence of defects. This initial scan determines the number and location of the initial defects. The x and y coordinates of the initial defects are determined and recorded relative to the positions of the scribe 12 and the wafer notch 11. Optionally, the presence and location of these initial defects may be used in concert with the coordinates of the notch 11 and scribe 12 to further enhance the fine alignment of the wafer 10 by serving as additional reference points.

In Step 312, after the position coordinates of the defects, scribe 12, and wafer notch 11 have been determined and recorded, the wafer 10 is then placed in another inspection tool for further analysis. The fine alignment to the coordinates of the scribe 12 and/or defects allows additional inspection or analysis tools to quickly and accurately navigate to defects without undue time wasted in searching for the defects. This allows each defect to be examined more closely to determine the extent of the defect and possible causes of the defect. Typically, the defects are subjected to analysis using a full-wafer scanning electron microscope that uses energy dispersive X-ray spectroscopy (EDS) or, alternatively, a method such as whole-wafer Auger spectroscopy. Additionally, other tools and methods available may be used for the analysis of defects detected on chips, for example: focused ion beam (FIB) systems, transmission electron microscopes, atomic force microscopes (AFM), Field Emission Scanning Electron Microscopes (FESEM), Ultra High Resolution Scanning Electron Microscopes (UHRSEM), X-ray photoelectron spectroscopes (XPS)/ electron spectroscopes, secondary ion mass spectroscopes (SIMS), field emission Auger electron spectroscopy (FEAES), or Fourier transform infrared spectroscopy (FTIR) are all techniques that can be used to identify compounds and defects on a wafer surface.

Using the position coordinates provided by the notch 11 and manufacturer's scribe 12, an inspection or analysis tool is able to navigate directly to each of the defects using high magnification. These tools use the position coordinates of the manufacturer's scribe 12 to correctly orient the wafer 10 each time it is moved to a different tool. The inspection or analysis tool reorients itself to the geometric pattern created by the manufacturer's scribe 12, then uses the position coordinates of the manufacturer's scribe 12 to realign the tool to the wafer 10 and then make de-skew calculations, orthogonality calculations, x-gain and y-gain calculations each time the wafer 10 is moved from tool to tool. The de-skew calculations determine if the wafer 10 has been rotated around its axis relative to the first examination of said wafer 10. The orthogonality calculations ensure that the x-axis and y-axis, as measured, are 90 degrees apart. The x-gain and the y-gain calculations ensure that the x-y coordinates measure the same difference when in different tools, for example, to correct for different calibration in a different tool relative to the first tool. For example, a first tool may measure x-distance between two points as 6 mm and a second tool may measure the same x-distance as 6.1 mm. The distance, as can be appreciated, is fixed. What is different is how the different tools measure the distance. The analysis or other tool, using these calculations, can then navigate from one defect to the next using magnification greater than or equal to 1,000 times without wasting undue time searching for defects.

Figure 9:
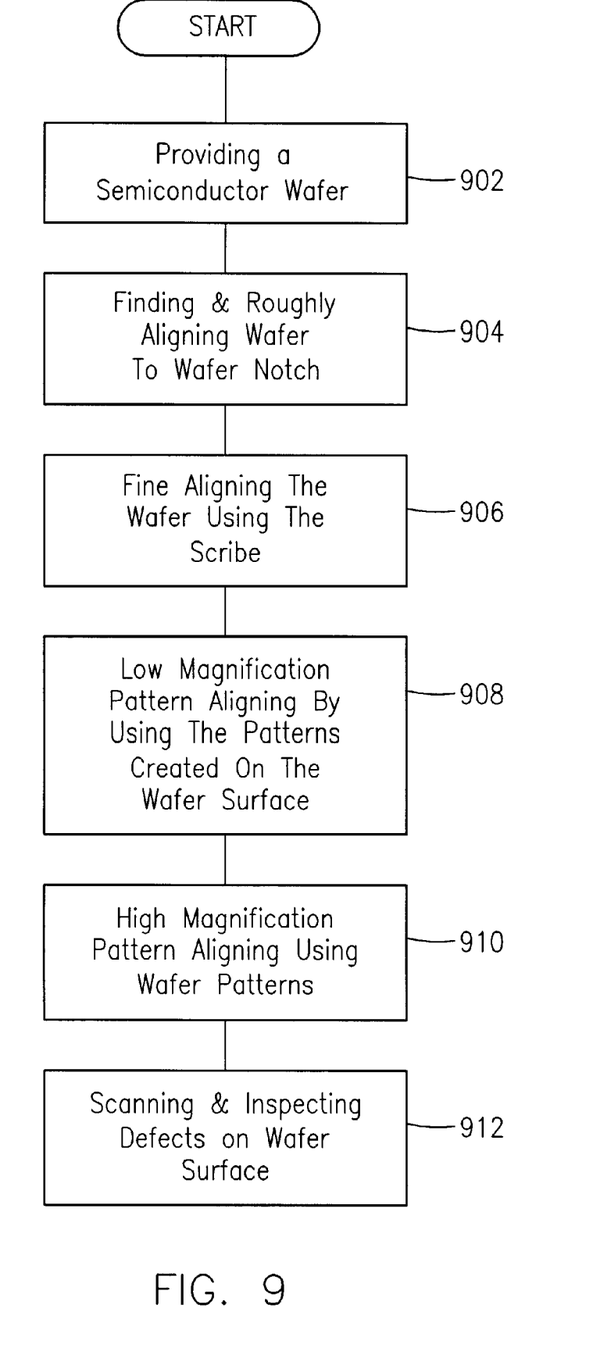
FIG. 9 is a flow diagram of a method of the present invention as applied to a processed semiconductor wafer.
Figure 10:
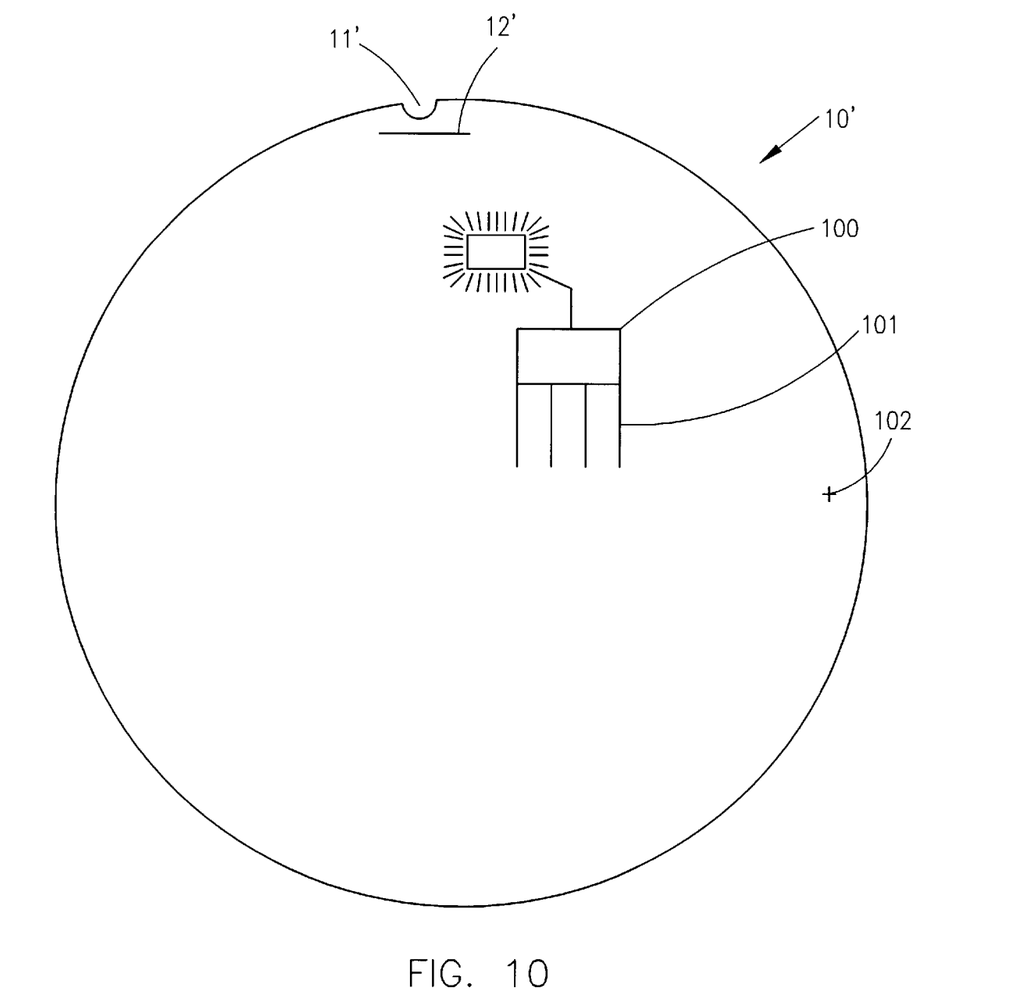
FIG. 10 is a plan view of a processed semiconductor wafer.

The present invention may also be used in aligning and orienting processed wafers 10' such as that shown in FIG. 10. The process is very similar to that used for unprocessed wafers 10 with the exception of a few additional alignment steps. Referring to FIGS. 9 and 10, a processed wafer 10' is provided and placed in an inspection tool in Step 902. Subsequently, the processed wafer 10' is roughly aligned by finding and aligning to the wafer notch 11' in Step 904. Then the wafer 10' is aligned in Step 906 using the manufacturer's scribe 12' in a process similar to that set forth in Steps 306 and 308. In Step 908, the wafer may be more finely aligned using the patterns created on the surface of the wafer 10' during processing. For example, a specific feature such as a corner 100 or metallization line 101 or lithography masking reticle alignment mark 102 may be used to more finely align the wafer 10'. This is usually accomplished in a low magnification pattern alignment step 908 which further orients the wafer 10'. This is followed by a high magnification pattern alignment, Step 910, which very precisely aligns the wafer 10' for inspection. In Step 912, as in Steps 310 and 312, defects are scanned and inspected.

The method of the present invention advantageously allows the wafer 10' to be sent through a series of process tools and subsequently conduct analysis of the effects of each of the tools. Current methods rely on the presence and location of defects on the surface of a wafer 10 to provide coordinate information. These defects are sometimes very small and consequently difficult to locate. The time-consuming nature of locating these defects significantly raises process costs. The present invention utilizes the manufacturer's scribe 12 which is easily located, thereby reducing inspection times. For example, a blank wafer 10 may be placed in an inspection tool and oriented using the manufacturer scribe 12. The wafer is scanned to determine the location of initial defects relative to the scribe 12. The coordinates of the defects are recorded in a defect map. Subsequently, after each step in a semiconductor fabrication process the wafer can be placed in an inspection tool, oriented, and scanned for defects. Because of a common reference point (the scribe) subsequent defect maps can be overlaid with prior maps and the location of defects can be compared. The appearance of new defects can be detected. The presence of new defects after a process step (e.g. lithography) usually indicates that the process introduced those defects. This is extremely useful to process engineer's trying to reduce the incidence of defect occurrence.

A further advantage of the present method of navigating to defects using the scribe 12 as a reference is that the scribe 12' may be used as a reference point even after the wafer 10' has been subject to many process steps. Because the scribe 12' is placed near the edge of the wafer 10', no processing takes place over the scribe 12'. Previously, defects were needed to provide the basis of coordinate systems. Since defects may be located anywhere on the surface of the wafer 10', they may be buried or obscured by process layers which are formed on top of the surface of the wafer 10'. If a defect is buried by a process layer, it becomes useless as a reference coordinate. One solution was the addition of fiducial marks to the surface of the wafer 10' by the IC manufacturer. This is time consuming and the very process of adding fiducial marks may cause more defects in the surface of the wafer 10. The method of the present invention avoids these drawbacks by using a manufacturer's scribe 12 as the basis of a coordinate reference system. The use of the scribe 12 avoids the drawbacks of prior methods by using a mark which is already in place on the wafer 10 when it reaches the IC manufacturer and is typically not covered by process materials during wafer manufacturing.

The present invention has been particularly shown and described with respect to certain preferred embodiments and features thereof. However, it should be readily apparent to those of ordinary skill in the art that various changes and modifications in form and detail may be made without departing from the spirit and scope of the invention as set forth in the appended claims. In particular, the entire manufacturer's scribe or any portion thereof may be used to achieve fine alignment of a wafer. The invention disclosed herein may be practiced without any element not specifically disclosed herein.

What is claimed is:

1. A method for analyzing defects on an unprocessed wafer comprising the steps of:
   (a) providing an unprocessed wafer, said wafer having a wafer manufacturer's identification scribe;
   (b) placing said unprocessed wafer in an inspection tool;
   (c) recording position coordinates of said scribe;
   (d) detecting defects on said unprocessed wafer and recording position coordinates of the defects relative to the position of said scribe;
   (e) placing the wafer in an analysis tool;
   (f) aligning the wafer using the position coordinates of the scribe; and
   (g) navigating directly to the recorded position of each of said defects and examining said defects with said analysis tool.

2. The method of claim 1, further comprising performing orthogonality calculations, x-gain and y-gain calculations, using the position coordinates of said scribe.

3. The method of claim 1, further comprising placing the unprocessed wafer in a process tool and subjecting said unprocessed wafer to processing.

4. The method of claim 3, further comprising:
   (h) detecting a second set of defects on the wafer caused by said process tool;
   (i) recording the position coordinates of said second set of defects in relation to the position of said scribe;
   (j) placing the wafer in an analysis tool;
   (k) performing alignment calculations using the position coordinates of the scribe;
   (l) navigating directly to the position of each of the second set of defects on the wafer at high magnification; and
   (m) inspecting each of said second set of defects with said analysis tool.

5. The method of claim 3, further comprising:
   detecting a second set of defects on the wafer caused by said process tool and recording the position coordinates of said second set of defects in relation to the position of said scribe;
   placing the wafer in an analysis tool;
   performing alignment calculations using the position coordinates of the scribe; and
   navigating directly to the position of each of the second set of defects on the wafer at high magnification.

6. The method of claim 5, further comprising performing an analysis of each of said second set of defects.

7. The method of claim 5, further comprising performing orthogonality calculations, x-gain and y-gain calculations, using the position coordinates of the scribe.

8. A method for analyzing defects on an unprocessed wafer, comprising the steps of:
   (a) providing an unprocessed wafer, said wafer having a notch and a wafer manufacturer's identification scribe;
   (b) locating and roughly aligning said wafer using the notch;
   (c) locating the scribe;
   (d) finely aligning to the scribe at high magnification;
   (e) scanning for the presence and recording the location of a first set of defects relative to said scribe; and
   (f) inspecting said defects at high magnification.

9. The method of claim 8, wherein said step of defect inspection (f) includes the steps of:
- (i) placing the unprocessed wafer in an analysis tool;
- (ii) aligning said analysis tool using said scribe;
- (iii) navigating directly to the recorded position of each of said defects on the unprocessed wafer at high magnification; and
- (iv) inspecting said defects at high magnification.

10. A method as in claim 8 wherein said step of finely aligning to the scribe (d) comprises the following steps:
- (i) switching said inspection tool to higher magnification;
- (ii) scanning the scribe to find and record the coordinates of a left-most and a right-most dot;
- (iii) scanning to the left-most dot defining and recording the coordinates of a vertical line which comprises a left side of a geometrical shape;
- (iv) scanning to the right-most dot defining and recording the coordinates of a vertical line which comprises the right side of said geometrical shape;
- (v) scanning to a bottom-most row of dots of said scribe and recording the position and coordinates of said bottom-most row of dots defining a horizontal line which defines a bottom side of said geometrical shape; and
- (vi) scanning upwards to a top-most row of dots of said scribe and recording the position and coordinates of said top-most row of dots defining a horizontal line which defines a top side of said geometrical shape.

11. A method as in claim 8 wherein said step of finely aligning to the scribe (d) comprises the following steps:
- (i) switching said inspection tool to higher magnification; and
- (ii) scanning the scribe to find a row of dots and recording the position and coordinates of said row of dots defining a line which defines a geometrical shape.

12. A method for aligning a semiconductor wafer comprising the steps of:
- (a) providing a semiconductor wafer, said wafer having a wafer manufacturers' identification scribe, said scribe having boundaries;
- (b) placing said wafer in a first inspection tool;
- (c) locating said scribe;
- (d) orienting said wafer using said scribe; and
- (e) recording position coordinates of said scribe.

13. A method as in claim 12 wherein said step of orienting said wafer using said scribe (d) comprises the following steps:
- (i) focusing said inspection tool on said scribe;
- (ii) switching said inspection tool to higher magnification;
- (iii) scanning the scribe to define and record the position of the boundaries of the scribe; and
- (iv) defining a geometrical shape using the boundaries of said scribe.

14. A method as in claim 13 wherein said boundaries of said scribe are comprised of a series of dots.

15. A method as in claim 14 wherein said step of defining a geometrical shape using the boundaries of said scribe (iv) comprises the following steps:
- (A) scanning to a left-most dot of said scribe defining and recording the coordinates of a vertical line which comprises a left side of a geometrical shape;
- (B) scanning to a right-most dot of said scribe defining and recording the coordinates of a vertical line which comprises the right side of said geometrical shape;
- (C) scanning to a bottom-most row of dots of said scribe and recording the position and coordinates of said bottom-most row of dots defining a horizontal line which defines a bottom side of said geometrical shape; and
- (D) scanning upwards to a top-most row of dots of said scribe and recording the position and coordinates of said top-most row of dots defining a horizontal line which defines a top side of said geometrical shape.

16. A method as in claim 12, whereby semiconductor wafer defects introduced by processing are detected using further steps comprising:
- (f) a first scanning of said wafer for defects and recording position coordinates of a first set of defects relative to the position coordinates of said scribe;
- (g) subjecting the wafer to processing;
- (h) placing said wafer in a second inspection tool;
- (i) aligning the wafer using the position coordinates of the scribe;
- (j) second scanning of said wafer for defects and recording position coordinates of a second set of defects relative to the position coordinates of said scribe; and
- (k) comparing said first set of defects to the second set of defects to determine said processing has introduced new defects.

17. A method as in claim 16, comprising the further steps of:
- (l) recording the position coordinates of said new defects;
- (m) placing said wafer in an analysis tool;
- (n) aligning said wafer using said scribe;
- (o) navigating directly to the position of each of the new defects on the wafer at high magnification; and
- (m) inspecting each of said new defects with said analysis tool.

\* \* \* \* \*